(12) United States Patent
Kozicki

(10) Patent No.: US 6,388,324 B2
(45) Date of Patent: May 14, 2002

(54) SELF-REPAIRING INTERCONNECTIONS FOR ELECTRICAL CIRCUITS

(75) Inventor: Michael N. Kozicki, Phoenix, AZ (US)

(73) Assignee: Arizona Board of Regents, Phoenix, AZ (US)

( * ) Notice: Subject to any disclaimer, the term of this patent is extended or adjusted under 35 U.S.C. 154(b) by 0 days.

(21) Appl. No.: 09/386,789

(22) Filed: Aug. 31, 1999

Related U.S. Application Data

(60) Provisional application No. 60/098,609, filed on Aug. 31, 1998.

(51) Int. Cl.⁷ .................................................. H01L 23/52
(52) U.S. Cl. ....................................................... 257/750
(58) Field of Search ............................. 257/4, 750, 741, 257/743, 748, 762, 766; 438/900, 102, 95

(56) References Cited

U.S. PATENT DOCUMENTS 5,761,115 A * 6/1998 Kozicki et al. ............. 365/182
6,030,853 A * 2/2000 Tregilgas et al. ............. 438/95

* cited by examiner

*Primary Examiner*—Olik Chaudhuri
*Assistant Examiner*—Ginette Peralta
(74) *Attorney, Agent, or Firm*—Snell & Wilmer LLP

(57) ABSTRACT

A self-repairing interconnection system and methods for forming the system are disclosed. The system includes a metal pathway adjacent a metal-doped chalcogenide material. The system is configured to repair defects in the metal pathway by donating metallic ions from the metal-doped chalcogenide material to the metal pathway.

10 Claims, 1 Drawing Sheet

Initial defect

Thinned high resistance region

Repaired defect

SELF-REPAIRING INTERCONNECTIONS FOR ELECTRICAL CIRCUITS

RELATED APPLICATIONS

Figure 1:
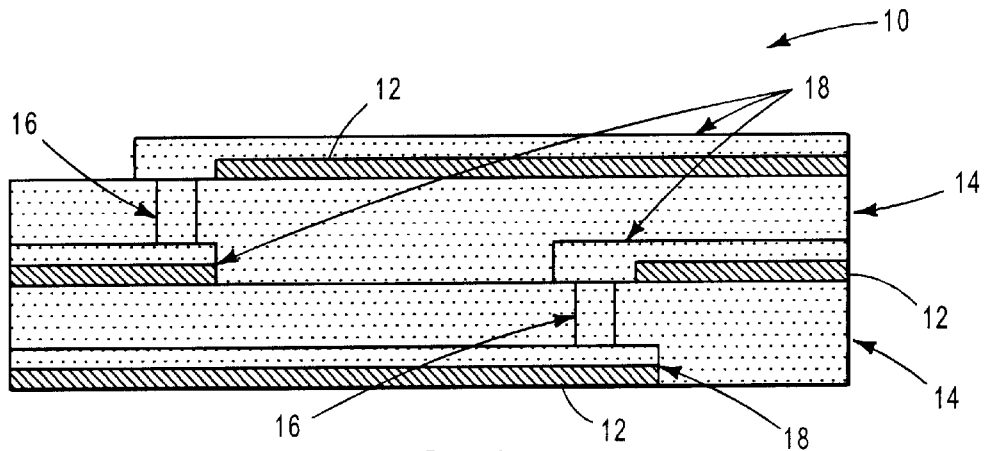

This application claims the benefit of Provisional Application Ser. No. 60/098,609, filed Aug. 31, 1998 and priority to U.S. Pat. No. 6,084,796, which issued to Kozicki et al. on Jul. 4, 2000.

TECHNICAL FIELD

The present invention generally relates to methods and apparatus for forming self-repairing interconnections for electrical circuits. More particularly, the present invention relates to an interconnection system using metal-doped chalcogenide material in contact with metal interconnections which heal defects in the metal interconnections.

BACKGROUND

The performance and cost of electronic systems have improved continuously due in part to advances in manufacturing progressively smaller electronic devices. Advances in semiconductor technology have resulted in a tremendous reduction in the feature sizes of electronic devices, thereby increasing the density of electrical circuits. In fact, over the past two decades, the density of components which can be located on a single microchip has increased by a factor of 100 per decade.

As the density of components has increased, so has the requirement for the density of interconnection pathways formed between these components. In order to increase the density of interconnection pathways the size of interconnections must be reduced. Small geometry interconnections, however, are highly prone to failure by electromigration at points where the lines have a reduced cross-section due to thinning at topographical features (e.g., an underlying step), line narrowing by reflective notching during a photolithography step, and morphological effects such as width variations at grain boundaries after etching. The ultimate quality and reliability of many electronic systems are determined largely by the reliability of the interconnection system.

To mitigate problems associated with high density devices and increase device reliability, metal lines are desirably designed or made wider than the minimum lithographical line width, preferably by a factor of two or more, to reduce current density at the thin regions of the lines and thereby reduce electromigration. Manufacturing devices th wider lines, however, reduces the overall interconnection density for the devices.

Therefore, interconnections capable of healing defects and/or breaks in interconnection pathways are highly desirable to thereby increase overall system reliability.

SUMMARY OF THE INVENTION

The present invention relates to methods and apparatus for forming self-healing interconnections for electrical circuits. In accordance with an exemplary embodiment of the present invention, an interconnection metal (e.g., copper, silver, and the like). is deposited on a layer of metal-doped chalcogenide material. When breaks occur in the interconnection metal, the break is healed (i.e., filled in) by the formation of a metal element formed by metal precipitation at the break.

BRIEF DESCRIPTION OF THE DRAWING FIGURES

Figure 2A:
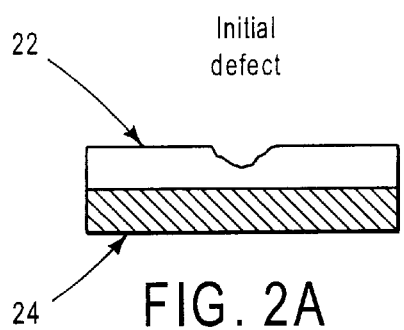
Figure 2B:
Figure 2C:
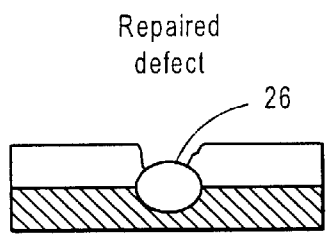

The present invention will hereinafter be described in conjunction with the appended drawing figures, wherein like numerals denote like elements, and:

FIG. 1 is a sectional schematic illustration of a multi-level interconnection system in accordance with one aspect of the present invention; and FIGS. 2A–2C are schematic depictions of a break and healing process in an interconnection pathway in accordance with the present invention.

DETAILED DESCRIPTION OF THE INVENTION

In order to provide a more thorough understanding of the present invention, the following description sets forth numerous specific details, such as specific material, parameters, etc. However, these specific details need not be employed to practice the present invention.

With reference to FIG. 1, a multi-level self-healing interconnect system 10 in accordance with a preferred embodiment of the present invention is shown. In accordance with one aspect of the present invention, interconnection system 10 includes a plurality of metal interconnection pathways 18 in contact with a metal-doped chalcogenide material 12, dielectric separation layers 14, and vias 16.

In accordance with one aspect of the present invention, a suitable metal-doped chalcogenide material includes any compound containing sulfur, selenium and/or tellurium, whether ternary, quaternary or higher compounds. In a preferred embodiment of the present invention, the chalcogenide material is selected from the group consisting of arsenic, germanium, selenium, tellurium, bismuth, nickel, sulfur, polonium and zinc (preferably, arsenic sulphide, germanium sulfide, or germanium selenide) and the metal comprises various Group I or Group II metals (preferably, silver, copper, zinc or a combination thereof). The metal-doped chalcogenide material may be obtained by photo dissolution, by depositing from a source comprising the metal and chalcogenide material, or by other means known in the art. For a more detailed discussion of metal-doped chalcogenide material, see U.S. Pat. No. 5,761,115, issued on Jun. 2, 1998 to Kozicki et al, the entire disclosure of which is incorporated herein by reference.

In an exemplary embodiment, chalcogenide material 12 is doped with silver or copper. In accordance with this embodiment, metal pathways 18 are also formed from silver or copper. However, any conductive material may be used as long as there are no adverse reaction between the conductor and the chalcogenide material.

In accordance with one aspect of the present invention, metal pathways 18 are deposited on and in contact with chalcogenide material 12 using any convenient deposition method. Although in FIG. 1 metal pathways 18 are depicted above chalcogenide material 12, metal pathways 18 can be deposited beneath or completely within chalcogenide material 12. Additionally, vias 14 are preferably kept free of the metal-doped chalcogenide material to minimize the resistance of the connection between interconnect layers.

With reference to FIG. 2A, a defect in a conductor pathway 22 can result from thinning at topographical features (e.g., an underlying step), line narrowing by reflective notching during a photolithography step, morphological effects such as width variations at grain boundaries after etch, and the like. With additional reference to FIG. 2B, as a weak region 23 in conductor pathway 22 becomes thinner (e.g., by electromigration), pathway 22 resistance increases, thereby also increasing the voltage drop across pathway 22. With additional reference to FIG. 2C, this potential difference creates an electric field which moves dissolved metal ions from metal-doped chalcogenide material 24 to the most electrically negative part of the defect, whereupon the metal ions will come out of solution and form a solid metal element 26 (e.g., a dendrite) at the surface of chalcogenide material 24. Metal element 26 will grow until the defect is bridged (i.e., returned to a low resistance state). Although metal element 26 is depicted in FIG. 2C as substantially oval, metal element 26 may assume any suitable shape.

In this manner, defects and breaks in interconnection pathways can be repaired insitu. Additionally, as described above, this repair mechanism is self-regulating as it will only operate when the defect resistance becomes high and will turn-off when the repair is complete. Accordingly, the present self-healing interconnection system provides for increased system reliability.

While preferred embodiments of the present invention have been shown in the drawings and described above, it will be apparent to one skilled in the art that various embodiments of the present invention are possible. For example, the present invention may be used to cure interconnection pathways in 3-dimensional circuits or any semiconductor or integrated circuit application. Therefore, the present invention should not be construed as limited to the specific form shown and described above.

I claim:

1. A self-healing interconnect system for repairing interconnections of a electrical circuit, the system comprising:

a repairable metal interconnection pathway electrically coupling two portions of the circuit; and a metal-doped chalcogenide material adjacent said metal interconnection pathway.

2. The self-healing interconnect system of claim 1, wherein the metal-doped chalcogenide includes material selected from the group consisting of arsenic, germanium, selenium, tellurium, bismuth, nickel, sulfur, polonium and zinc.

3. The self-healing interconnect system of claim 1, wherein the metal-doped chalcogenide includes metal selected from the group consisting of silver, copper and zinc.

4. The self-healing interconnect system of claim 1, wherein the metal interconnection pathway comprises copper.

5. The self-healing interconnect system of claim 1, wherein the metal interconnection pathway comprises silver.

6. An integrated circuit including the self-healing interconnect system of claim 1.

7. A method of forming a self-healing interconnect system for an electronic circuit, said method comprising of steps of:

forming a metal-doped chalcogenide material; and forming self-repairing interconnect pathways adjacent said metal doped chalcogenide material, wherein the self-repairing interconnect is configured to heal any defects in the pathway.

8. The method of forming a self-healing interconnect system of claim 7, wherein the step of forming a metal-doped chalcogenide material includes dissolving metal into the chalcogenide using photo dissolution.

9. The method of forming a self-healing interconnect system of claim 7, wherein the step of forming a metal-doped chalcogenide material includes depositing the metal-doped chalcogenide material from a source including the metal-doped chalcogenide material.

10. The method of forming a self-healing interconnect system of claim 7, further comprising the step of applying a voltage across at least one of the pathways to repair a defect in the at least one of the pathways.

* * * * *